United States Patent
Nagao et al.

(10) Patent No.: US 6,918,176 B2
(45) Date of Patent: Jul. 19, 2005

(54) MOUNTING APPARATUS OF ELECTRONIC PARTS AND MOUNTING METHODS OF THE SAME

(75) Inventors: Kazuhide Nagao, Fukuoka (JP); Takuya Tsutsumi, Fukuoka (JP); Takahiro Noda, Fukuoka (JP); Hideki Sumi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 420 days.

(21) Appl. No.: 10/087,927

(22) Filed: Mar. 5, 2002

(65) Prior Publication Data

US 2002/0138977 A1 Oct. 3, 2002

(30) Foreign Application Priority Data

Mar. 30, 2001 (JP) ........................................ 2001-098681

(51) Int. Cl.$^7$ ................................................ H05K 3/30
(52) U.S. Cl. .......................... 29/832; 740/833; 740/840
(58) Field of Search .......................... 29/740, 741, 743, 29/832, 833, 840; 290/740, 741, 743

(56) References Cited

U.S. PATENT DOCUMENTS

| 5,761,798 A | * | 6/1998 | Suzuki ........................ 29/832 |
| 5,778,525 A | | 7/1998 | Hata et al. |
| 5,855,059 A | * | 1/1999 | Togami et al. ................ 29/740 |

FOREIGN PATENT DOCUMENTS

| EP | 0 715 493 | 6/1996 |
| JP | 09-083196 | 3/1997 |
| JP | 09-083197 | 3/1997 |
| WO | 99/60836 | 11/1999 |

* cited by examiner

*Primary Examiner*—Carl J. Arbes
(74) *Attorney, Agent, or Firm*—Wenderoth, Lind & Ponack, L.L.P.

(57) ABSTRACT

An apparatus and method for mounting electronic parts wherein a transfer width between a pair of transfer rails is changeable according to a size of a substrate. A mounting head picks up electronic parts at a parts supply member and keeps its stand-by position for mounting the electronic parts on the substrate. The stand-by position of the mounting head is determined according to the changed amount of the transfer width.

2 Claims, 7 Drawing Sheets

MOUNTING APPARATUS OF ELECTRONIC PARTS AND MOUNTING METHODS OF THE SAME

CROSS REFERENCE TO RELATED APPLICATION

This application is based upon and claims the benefit of priority of Japanese Patent Application No. 2001-98681 filed on Mar. 30, 2001, the contents of which are incorporated herein by reference.

BACKGROUND OF THE INVENTION

1. Field of the Invention

The present invention relates to an apparatus and method for mounting electronic parts onto a substrate.

2. Description of Related Art

U.S. Pat. No. 5,778,525 discloses a conventional component mounting apparatus having two mounting heads for picking up electronic parts from component supply tables and mounting them onto a substrate (circuit board).

This type of the mounting apparatus, a so-called two-beam type, generally handles several kinds of substrates with various sizes. Every time the size of the substrate is changed, some adjustments, for example, changing a transfer width between transfer rails, are carried out. In this case, the transfer width is generally changed by moving only one of the transfer rails along the direction of the transfer width.

Accordingly, the traveling distance of the beam equipped with the mounting head corresponding to the moved transfer rail is different from the traveling distance of another beam equipped with another mounting head corresponding to the fixed transfer rail. This difference causes mounting operations and sequences between these beams to be unbalanced, which may cause undesirable interferences and/or waiting time between these beams.

SUMMARY OF THE INVENTION

Accordingly, it is an object of the present invention to provide an electronic parts mounting apparatus and method capable of improving mounting efficiency when the electronic parts mounting apparatus handles different kinds of substrates with various widths.

According to a first aspect of the present invention, a mounting apparatus has a pair of transfer rails for transferring a substrate in a transferring direction and for changing a transfer width between the transfer rails according to a size of the substrate, a parts supply member for supplying electronic parts, a mounting head for picking up the electronic parts supplied from the parts supply member and for mounting the electronic parts onto the substrate, a first driving member for moving the mounting head in the transferring direction, a second driving member for moving the mounting head in a width direction perpendicular to the transferring direction, and a stand-by position determining member for determining a stand-by position of the second driving member along the width direction according to the transfer width.

According to another aspect of the present invention, a mounting method includes a step of changing a transfer width between a pair of transfer rails according to a size of a substrate, a step of determining a stand-by position of a mounting head according to the transfer width, and a step of holding the mounting head at the stand-by position.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

DETAILED DESCRIPTION OF THE PREFERRED EMBODIMENTS (First Embodiment)

Figure 1:
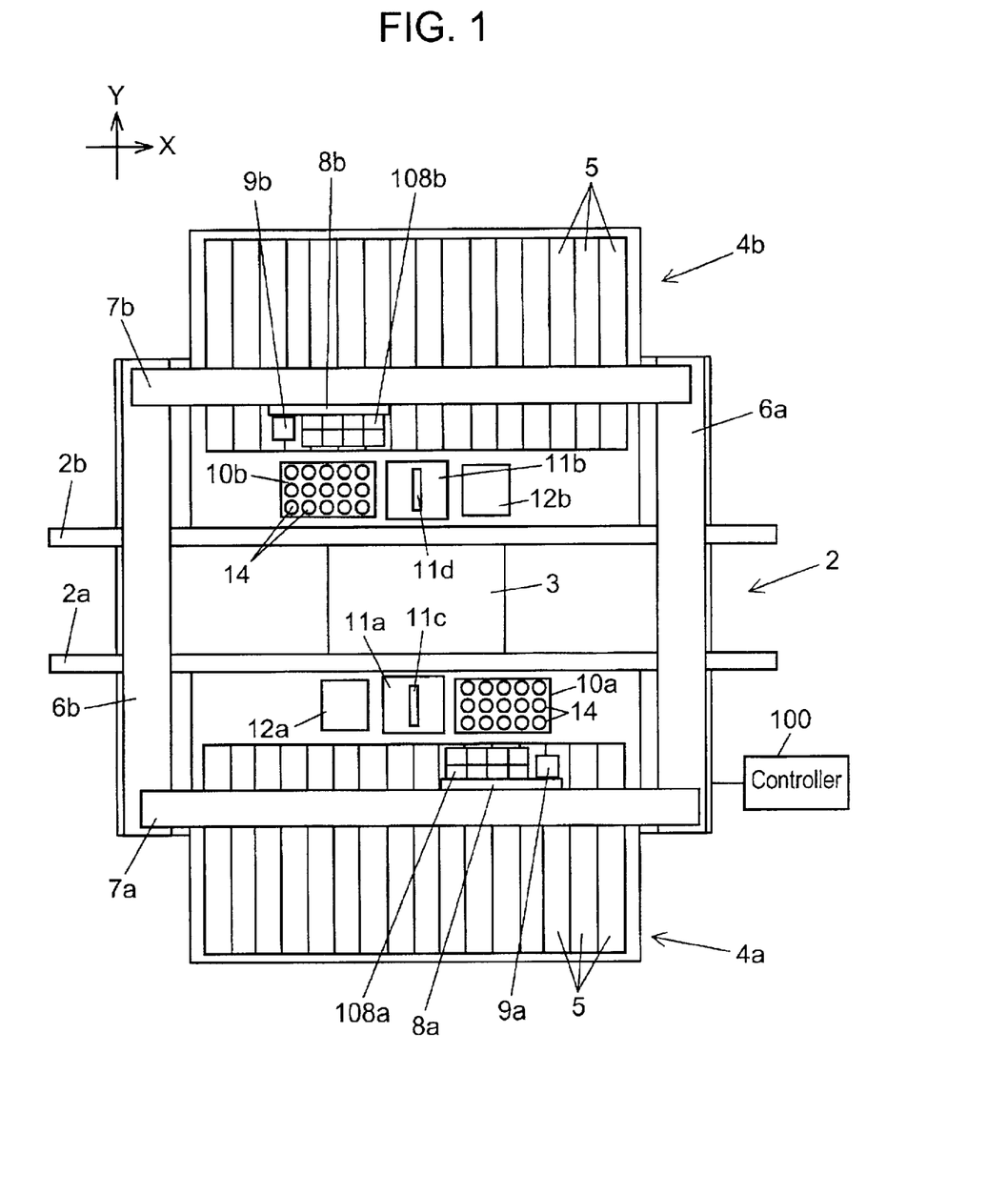
FIG. 1 is a top plan view of an electronic parts mounting apparatus according to a first embodiment of the present invention.

Referring to FIG. 1, an electronic parts mounting apparatus according to the first embodiment of the present invention is shown. A transfer passage 2 is formed in a direction of an X-axis at the center of a bed 1. The transfer passage 2 is formed by transfer rails 2a and 2b such that a substrate 3 is carried between the transfer rails 2a and 2b and is set in position. The transfer rail 2a is movable in a direction of a Y-axis which is perpendicular to the carrying direction, that is the direction of the X-axis. A transfer width, that is assistance between the transfer rails 2a and 2b, is changeable according to a size of the substrate 3 by moving the transfer rail 2a in the direction of the Y-axis.

Parts supply members 4a and 4b for supplying electronic parts are provided on both sides of the transfer passage 2. A number of tape feeders 5 are provided in a row at each of the parts supply members 4a and 4b. Each of the tape feeders 5 houses electronic parts held by a tape such that the electronic parts are supplied to a pickup position of mounting heads 8a and 8b by feeding the tapes pitch by pitch.

Y-axis tables 6a and 6b are provided on both ends of the bed 1. X-axis tables 7a and 7b are hung across the Y-axis tables 6a and 6b. X-axis tables 7a and 7b move on Y-axis tables 6a and 6b between the substrate 3 on the transfer passage 2 and each of the parts supply members 4a and 4b, respectively. X-axis tables 7a and 7b are equipped with the mounting heads 8a and 8b and cameras 9a and 9b, respectively. The mounting heads 8a and 8b move on X-axis tables 7a and 7b in the direction of the X-axis. X-axis tables 7a and 7b move on Y-axis tables 6a and 6b in the direction of the Y-axis.

Each of the mounting heads 8a and 8b are equipped with eight suction heads 108a and 108b, respectively. Each suction head sucks and holds electronic parts such that the mounting heads 8a and 8b pick up several electronic parts from the respective tape feeders 5 and move to mount these electronic parts on the substrate 3. The cameras 9a and 9b move on X-Y plane to recognize the substrate 3 according to the movement of the Y-axis tables 6a and 6b and the X-axis tables 7a and 7b.

Nozzle changing members 10a and 10b, recognition members 11a and 11b, and collection members 12a and 12b are provided in a row between the transfer passage 2 and each of the parts supply members 4a and 4b.

A number of suction nozzles 14, which are to be attached to each of the suction heads 108a and 108b of the mounting heads 8a and 8b, are arranged on the nozzle changing members 10a and 10b. Attachment and detachment of the suction nozzles 14 to and from the suction heads 108a and 108b are carried out by the mounting heads 8a and 8b at the nozzle changing members 10a and 10b. Accordingly, the most suitable suction nozzle 14 for each of the electronic parts is attached to each suction head of the mounting heads 8a and 8b.

The recognition members 11a and 11b are equipped with cameras 11c and 11d, respectively, to pick up images for recognizing the electronic parts held by the mounting heads 8a and 8b by moving the mounting heads 8a and 8b to the recognition members 11a and 11b.

The collection members 12a and 12b are containers for collecting non-packaged electronic parts which are not to be mounted on the substrate 3 according to the recognition by the cameras 11c and 11d.

According to the above described arrangements of the nozzle changing members 10a and 10b, recognition members 11a and 11b, and collection members 12a and 12b, the nozzle changing operation by moving the mounting heads 8a and 8b, the recognition operation by the cameras 11c and 11d, and the collecting operation of the non-packaged electronic parts are carried out effectively.

Each part of the electronic parts mounting apparatus is controlled by a controller 100. For example, the X-axis tables 7a and 7b and the Y-axis tables 6a and 6b are driven by motors (not shown) controlled by the controller 100.

Figure 2A:
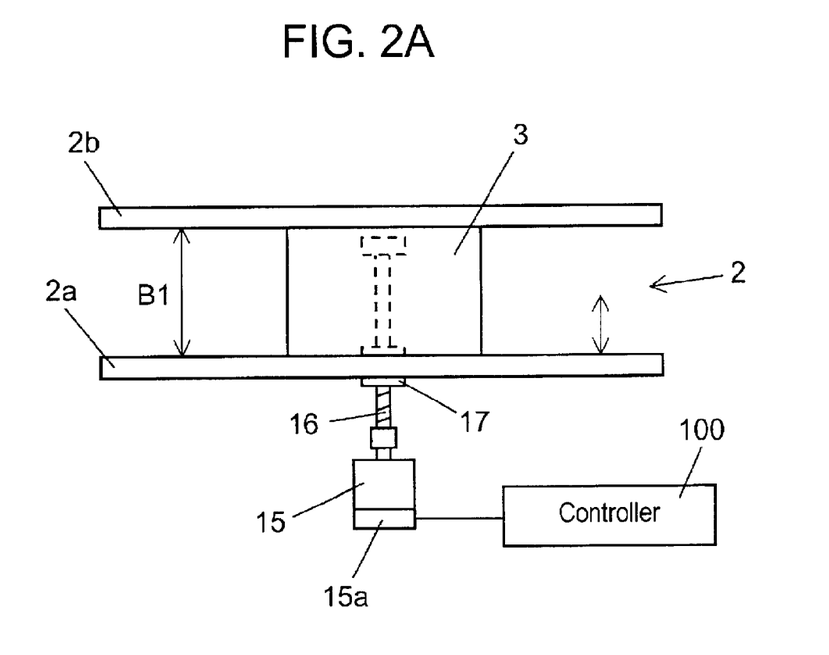
FIGS. 2A and 2B are illustrations showing a width adjustment mechanism of the electronic parts mounting apparatus according to the first embodiment of the present invention.
Figure 2B:
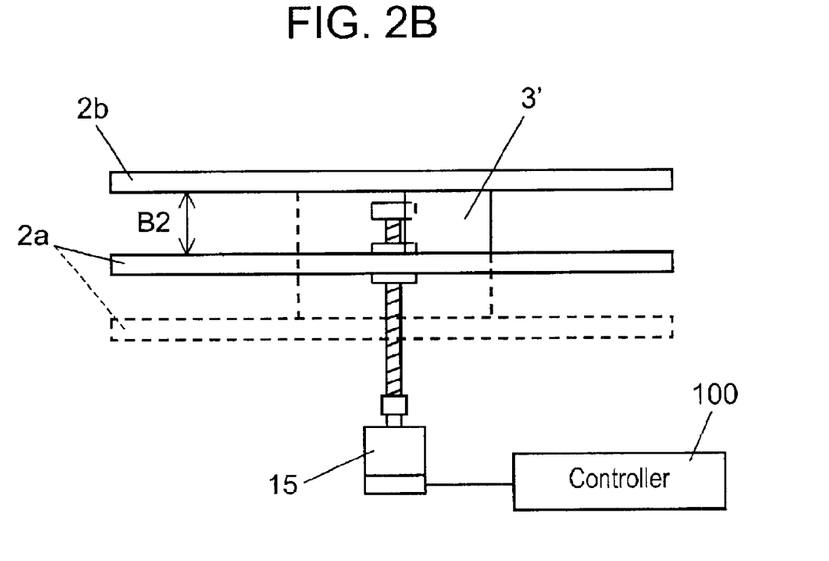

Referring to FIGS. 2A and 2B, a width adjustment mechanism of the transfer passage 2 will now be described. Referring to FIG. 2A, a nut 17, screwed on a feed screw 16 to be rotationally driven by a motor 15, is fixed on the transfer rail 2a. The transfer rail 2a moves in the direction of the transfer width, that is the direction of the Y-axis, when the motor 15 is driven. Accordingly, the transfer width between the transfer rails 2a and 2b can be changed according to the sizes of various types of substrates from a transfer width B2 for a small substrate 3', shown in FIG. 2B, to a transfer width B1 for a large substrate 3 shown in FIG. 2A.

To change the transfer width, a transfer width detection part 18 receives pulse signals from an encoder 15a attached to the motor 15, and the transfer width, that is a distance between the transfer rails 2a and 2b, is detected.

Figure 3:
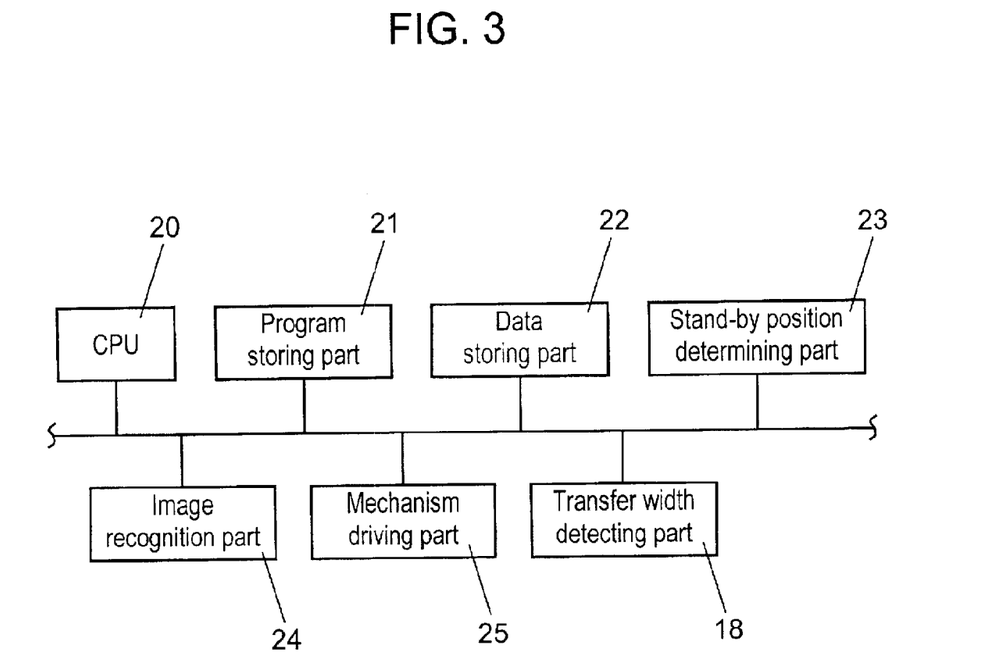
FIG. 3 is a block diagram showing a control system of the electronic parts mounting apparatus according to the first embodiment of the present invention.

The control system of the controller 100 is shown in FIG. 3. A central processing unit 20 carries out various calculations required for controlling each part of the electronic parts of the mounting apparatus. A program storing part 21, which includes a random access memory (RAM), stores programs necessary for various operations and calculations for the electronic parts mounting apparatus. A data storing part 22, which includes a read only memory (ROM), stores various data, such as the size of the substrate, types of the electronic parts and packaging data showing mounting position coordinates, for each substrate to be packaged.

A stand-by position determining part 23 determines stand-by positions of the X-axis tables 7a and 7b when the electronic parts picked up from the parts supply members 4a and 4b by the mounting heads 8a and 8b are transferred to the substrate 3. The stand-by position is determined based on the transfer width of the transfer passage 2 detected by the transfer width detecting part 18. In other words, the stand-by position determining part 23 determines stand-by positions according to the transfer width when the X-axis tables 7a and 7b reciprocate in the direction of the Y-axis during the mounting operation.

An image recognition part 24 carries out recognition processes for the substrate 3 recognized by the cameras 9a and 9b and recognition processes for the electronic parts recognized by the recognition members 11a and 11b.

A mechanism driving part 25 drives each mechanism, such as the X-axis tables 7a and 7b, the Y-axis tables 6a and 6b and the mounting heads 8a and 8b, according to command signals from the central processing unit 20.

The transfer width detecting part 18 detects the transfer width of the transfer passage 2 based on pulse signals received from the encoder 15a indicating the rotational position of the motor 15.

The transfer width detection method described above can be replaced by other methods. For example, the transfer width can be detected by an optical method which detects the position of the transfer rail 2a in the direction of width by using the cameras 9a and 9b. One of other examples is a mechanical micro switch provided on the transfer rail 2a. When the mechanical micro switch turns on during the movement of the mounting head 8a in the direction of the Y-axis, the position of the transfer rail 2a is detected. Another example is to use the substrate width data obtained from the packaging data as the transfer width instead of detecting the transfer width.

Figure 4A:
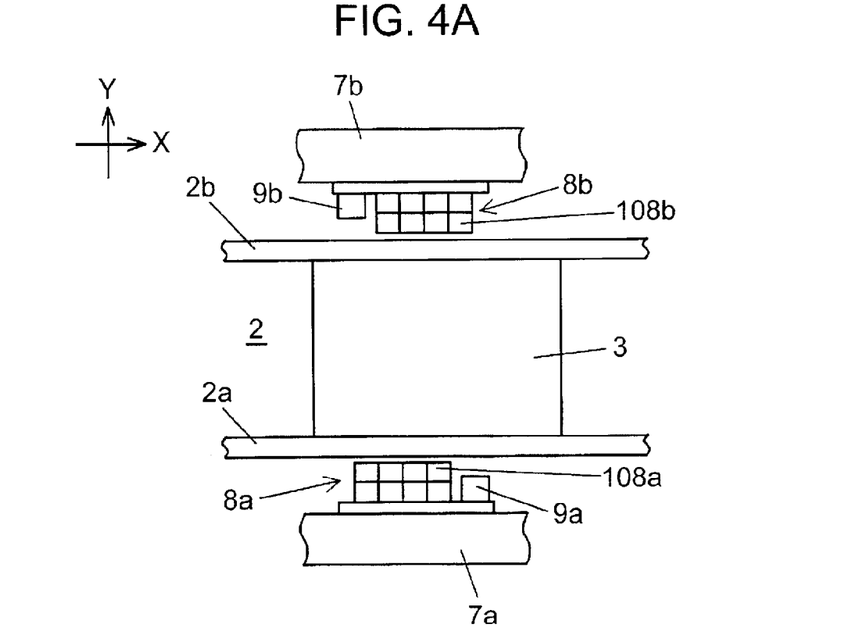
FIGS. 4A and 4B are illustrations showing stand-by positions of an X-axis table of the electronic parts mounting apparatus according to the first embodiment of the present to invention.
Figure 4B:
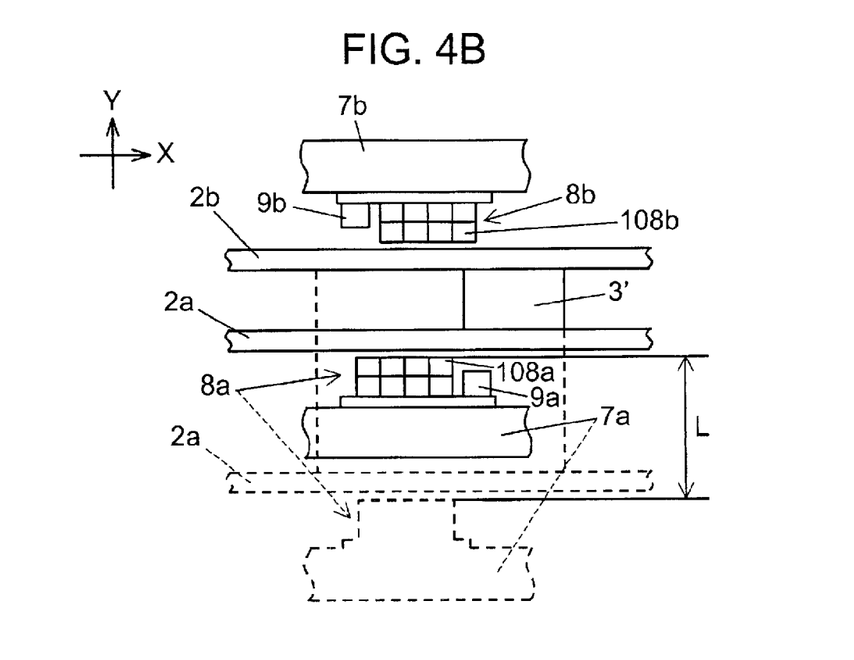

Referring to FIGS. 4A and 4B, a stand-by position of the mounting heads 8a and 8b will now be described. During the packaging operation, that is when the mounting heads 8a and 8b are moved by the X-axis tables 7a and 7b and the Y-axis tables 6a and 6b to mount the electronic parts on the substrate 3, a number of electronic parts corresponding to the number of suction heads are mounted on the substrate 3 by one reciprocating motion of the mounting heads 8a and 8b between the parts supply members 4a and 4b and the substrate 3 located on the transfer passage 2.

Since the two mounting heads, that is the mounting heads 8a and 8b, are used for the mounting operation for the substrate 3, interference prevention for preventing the interference of the movement between the mounting heads 8a and 8b is carried out in the packaging sequence which defines the order of the mounting operation.

Specifically, while one of the mounting heads 8a and 8b is in the mounting operation, the other mounting head is not allowed to start the mounting operation on the substrate 3, even if the other mounting head finishes the pick-up operation of the electronic parts at the parts supply member 4a or 4b and the recognition operation by the recognition member 11a or 11b. In other words, the packaging sequence is determined such that one of the mounting heads 8a and 8b waits in its stand-by position until the other mounting head finishes its mounting operation on the substrate 3 and moves away from the substrate 3.

The stand-by position is generally determined such that the mounting heads 8a and 8b do not interfere each other at the position closest to the transfer passage 2. The stand-by position is also determined as position data on the Y-axis when the X-axis tables 7a and 7b reciprocate in the direction of the Y-axis via the Y-axis tables 6a and 6b.

A stand-by position for a large substrate 3 is shown in FIG. 4A. Referring to FIG. 4A, both of the X-table 7*b* for the fixed transfer rail 2*b* and the X-table 7*a* for the movable transfer rail 2*a* are in their own stand-by positions such that the mounting heads 8*a* and 8*b* do not overhang the substrate 3.

A stand-by position for a small substrate 3', which has a smaller width compared to the large substrate 3, is shown in FIG. 4B. Referring to FIG. 4B, the X-axis table 7*b* for the fixed transfer rail 2*b* is in the same stand-by position as the one for the large substrate 3. The stand-by position of the X-axis table 7*a* for the movable transfer rail 2*a*, however, is changed such that the X-axis table 7*a* moves toward the substrate 3' by a distance L. In other words, the stand-by position of the X-axis table 7*a* for the movable transfer rail 2*a* is changed according to the movement of the movable transfer rail 2*a* to adjust the transfer width. Accordingly, a new stand-by position is determined at the closest position to the substrate 3' preventing the mounting head 8*a* from overhanging the substrate 3'.

According to the first embodiment of the present invention, the total traveling length of the mounting head 8*a* during the reciprocating motions of the mounting head 8*a* to and from the substrate 3' is reduced because the stand-by position for the smaller substrate 3' is closer to the substrate 3' by the distance L compared to the stand-by position for the large substrate 3. Therefore, the total traveling time of the mounting head 8*a* is minimized, and the tact time is reduced.

Furthermore, the traveling distance of the mounting head 8*a* is approximately equal to that of the mounting head 8*b* since the stand-by positions of the mounting heads 8*a* and 8*b* are symmetrical regarding the substrate 3 even after the stand-by position of the mounting head 8*a* is changed. Accordingly, the well-balanced traveling sequence is achieved, This well-balanced traveling sequence prevents wasted time caused by unbalanced operations between the mounting heads 8*a* and 8*b*.

The first embodiment of the present invention includes a step of adjusting the transfer width by moving the movable transfer rail 2*a* according to the size of the substrate and a step of determining the stand-by position of the X-axis table 7*a* according to the adjusted transfer width when the electronic parts are mounted on the substrate by the mounting head 8*a*. Accordingly, the mounting heads 8*a* and 8*b* move without wasted movement according to the width of the target substrate compared to a conventional mounting apparatus which determines the stand-by position regardless of the change of the transfer width.

In other words, access time (tact time) of the mounting heads 8*a* and 8*b* between the stand-by position and the substrate on the transfer passage 2 is minimized. Thus, the mounting efficiency is improved.

Although only one of the transfer rails 2*a* and 2*b* is movable in the first embodiment, it is possible to make both of the transfer rails 2*a* and 2*b* movable instead.

(Second Embodiment)

Figure 5:
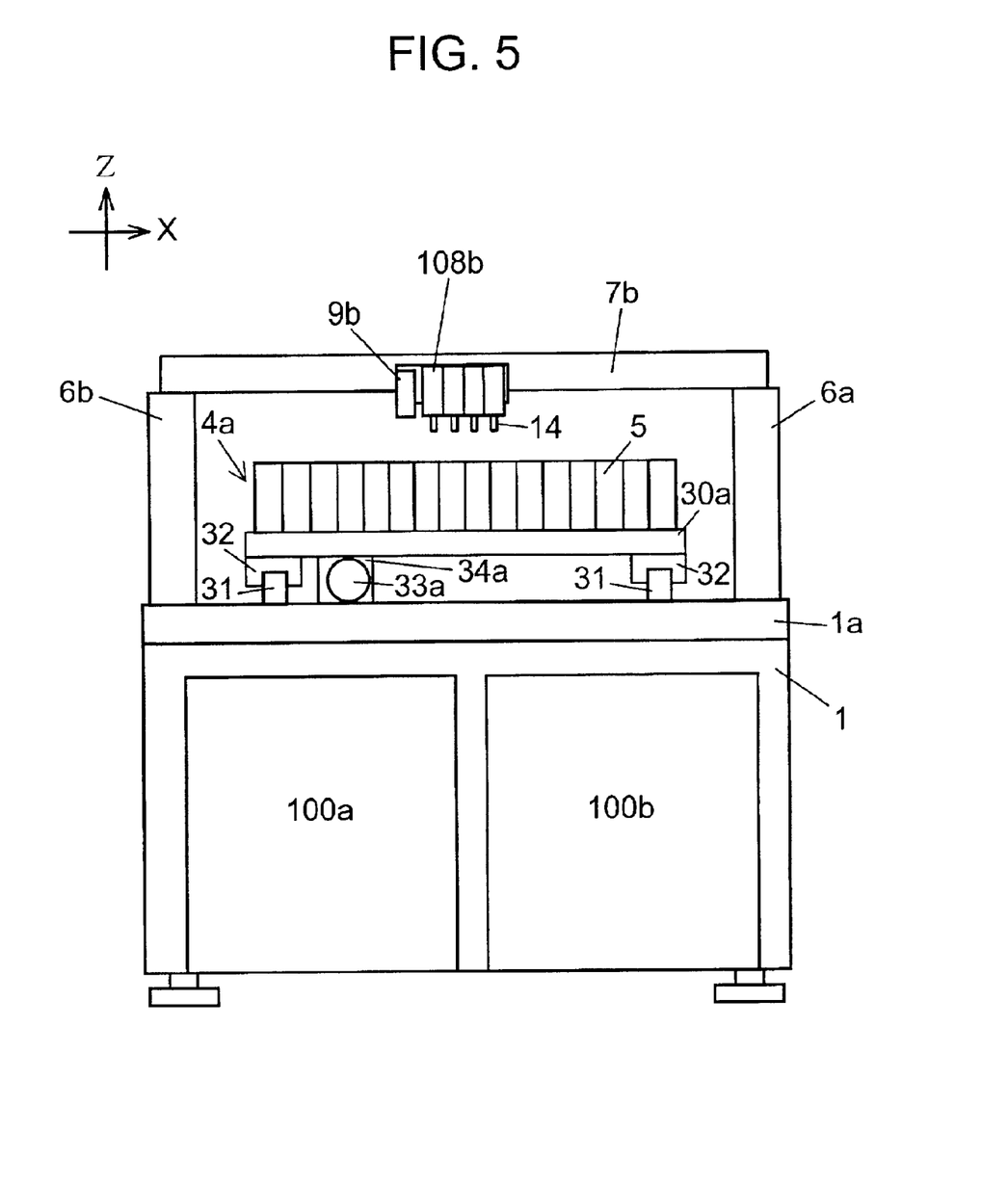
FIG. 5 is a schematic front elevational view showing a part of an electronic parts mounting apparatus according to a second embodiment of the present invention.
Figure 6:
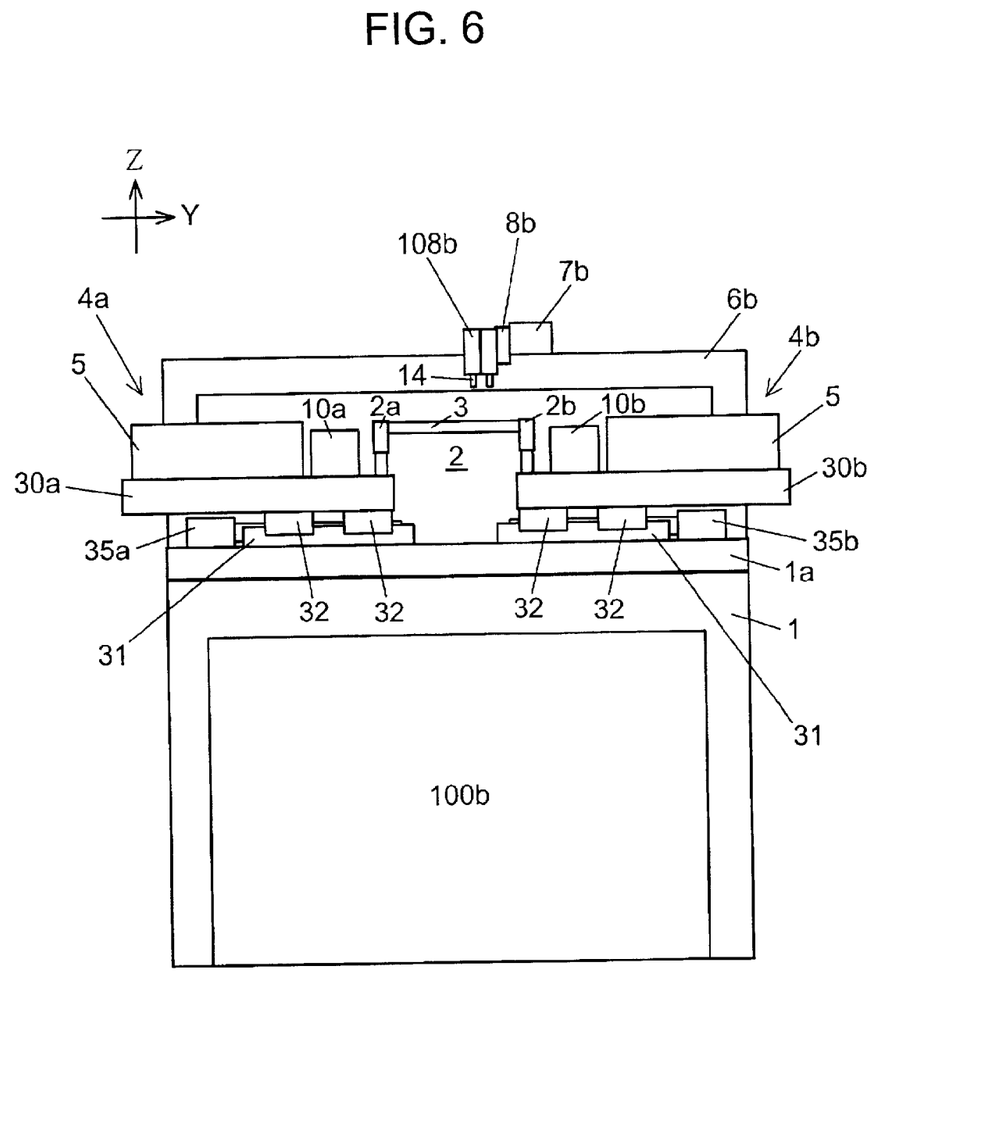
FIG. 6 is a schematic side elevational view showing the electronic parts mounting apparatus according to the second embodiment of the present invention.
Figure 7:
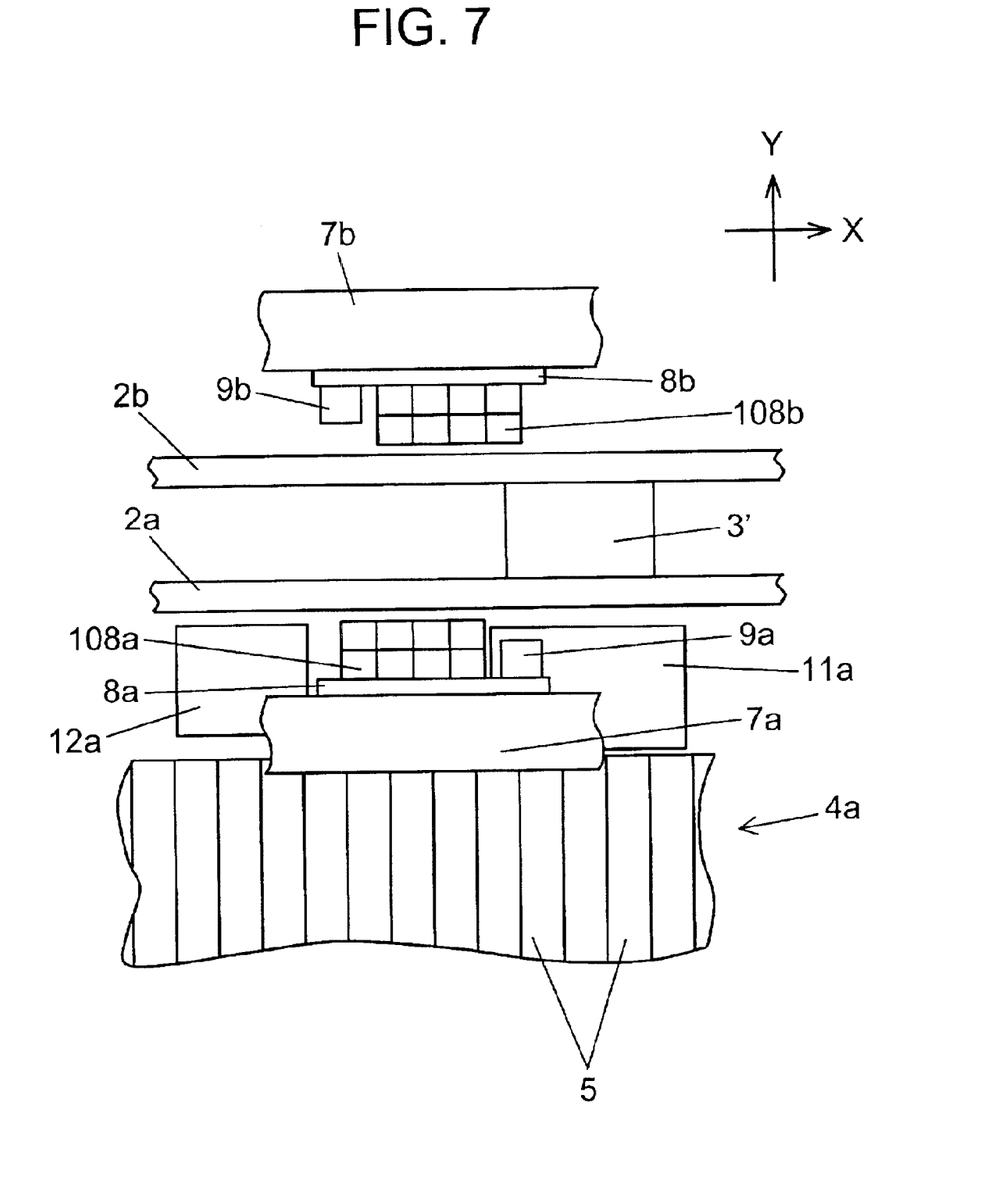
FIG. 7 is an illustration showing a stand-by position of an X-axis table of the electronic parts mounting apparatus according to the second embodiment of the present invention.

Referring to FIGS. 5, 6 and 7, a second embodiment of the present invention will now be described. This second embodiment is an arrangement of the first embodiment such that the transfer rails 2*a* and 2*b* move integrally with other elements including the parts supply members 4*a* and 4*b*. In the second embodiment, components which are substantially the same as those in the first embodiment are assigned the same reference numerals.

Referring to FIGS. 5 and 6, a pair of guide rails 31 are mounted on a base 11*a* of the bed 1 along the Y-axis on each side of the transfer passage 2. Sliders 32 are loosely fitted with the guide rails 31 so that the sliders 32 slide on the guide rails 31. The sliders 32 are also attached to the lower surfaces of movable bases 30*a* and 30*b* horizontally located at each side of the transfer passage 2.

The parts supply members 4*a* and 4*b* including the tape feeders 5 are placed on the movable bases 30*a* and 30*b*, respectively. The transfer rails 2*a* and 2*b* are mounted on the inner ends of the movable bases 30*a* and 30*b*, respectively.

Controllers 100*a* and 100*b* control various operations of the electronic parts mounting apparatus as described in the first embodiment of the present invention.

As described in the first embodiment, the nozzle changing members 10*a* and 10*b*, the recognition members 11*a* and 11*b*, and the collection members 12*a* and 12*b* in the second embodiment are also placed between the transfer rails 2*a*, 2*b* and the parts supply members 4*a*, 4*b*.

A motor 35*a* rotates a feed screw 33*a*. A nut 34*a*, screwed with the feed screw 33*a*, is fixed to the lower surface of the movable base 30*a*. Another motor 35*b* also employs the same mechanism at the movable base 30*b*. Accordingly, the transfer rails 2*a* and 2*b*, the parts supply members 4*a* and 4*b*, the nozzle changing members 10*a* and 10*b*, the recognition members 11*a* and 11*b*, and the collection members 12*a* and 12*b* are integrally driven by the motors 35*a* and 35*b* along the Y-axis.

FIG. 7 corresponds to FIG. 4B and shows a stand-by position of an X-axis table for the small substrate 3'. Just as the transfer width is adjusted in accordance with the width of the substrate and the stand-by position of the X-axis tables 7*a* and 7*b* (mounting heads 8*a* and 8*b*) along the Y-axis is determined in accordance with the adjusted transfer width in the first embodiment, the transfer width is adjusted in accordance with the width of the substrate and the stand-by position of the X-axis tables 7*a* and 7*b* (mounting heads 8*a* and 8*b*) along the Y-axis is determined in accordance with the adjusted transfer width in the second embodiment. It is possible to adjust only one of the transfer rails 2*a* and 2*b*. It is also possible to move both of the transfer rails 2*a* and 2*b* symmetrically.

According to the second embodiment, access time (tact time) of the mounting heads 8*a* and 8*b* between the stand-by position and the substrate on the transfer passage 2 is reduced the same as the first embodiment. Furthermore, the distance between the parts supply members 4*a* and 4*b* and the stand-by position of the X-axis tables 7*a* and 7*b* (mounting heads 8*a* and 8*b*) is minimized according to the second embodiment because the transfer rails 2*a* and 2*b* integrally move with the parts supply members 4*a* and 4*b* along the Y-axis. Thus, the mounting efficiency is improved.

Although the present invention has been described in connection with the preferred embodiments thereof with reference to the accompanying drawings, it is to be noted that various changes and modifications will be apparent to those skilled in the art. Such changes and modifications are to be understood as being included within the scope of the present invention as defined in the appended claims.

What is claimed is:

1. A method of mounting electronic parts on a substrate, said method comprising:

changing a transfer width between a pair of transfer rails according to a size of the substrate;

determining a first stand-by position of a first mounting head according to the transfer width;

picking up electronic parts from a first parts supply member with the first mounting head;

holding the first mounting head with the electronic parts picked up at the first stand-by position; and mounting the electronic parts onto the substrate, wherein said changing of the transfer width includes moving the first parts supply member integrally with the pair of transfer rails.

2. A method of mounting electronic parts on a substrate, said method comprising:

changing a transfer width between a pair of transfer rails according to a size of the substrate;

determining a first stand-by position of a first mounting head according to the transfer width;

picking up electronic parts from a first parts supply member with the first mounting head;

holding the first mounting head with the electronic parts picked up at the first stand-by position; and mounting the electronic parts onto the substrate, wherein said determining of the first stand-by position further includes determining a second stand-by position of a second mounting head according to the transfer width, said picking-up of the electronic parts further includes picking up the electronic parts from a second parts supply member by the second mounting head, said holding of the first mounting head includes holding the first mounting head at the first stand-by position while the second mounting head mounts the electronic parts onto the substrate and holding the second mounting head at the second stand-by position while the first mounting head mounts the electronic parts onto the substrate, and said changing of the transfer width includes moving the first and second parts supply members integrally with the pair of transfer rails.

* * * * *